United States Patent
Huang et al.

(10) Patent No.: US 8,824,158 B2
(45) Date of Patent: Sep. 2, 2014

(54) SUPPORT MECHANISM AND ELECTRONIC DEVICE

(75) Inventors: Chun-Ta Huang, New Taipei (TW); Shing-Huei Lin, New Taipei (TW)

(73) Assignee: Chi Mei Communication Systems, Inc., New Taipei (TW)

( * ) Notice: Subject to any disclaimer, the term of this patent is extended or adjusted under 35 U.S.C. 154(b) by 339 days.

(21) Appl. No.: 13/278,320

(22) Filed: Oct. 21, 2011

(65) Prior Publication Data

US 2012/0275131 A1 Nov. 1, 2012

(30) Foreign Application Priority Data

Apr. 27, 2011 (TW) .............................. 100114584 A

(51) Int. Cl.
*H05K 5/00* (2006.01)
(52) U.S. Cl.
USPC ........................................ 361/759; 455/575.3
(58) Field of Classification Search
USPC ........................................ 361/759; 455/575.3
See application file for complete search history.

(56) References Cited

U.S. PATENT DOCUMENTS

| | | | | |
|---|---|---|---|---|
| 8,023,040 | B2 * | 9/2011 | Zhou | 348/376 |
| 8,243,432 | B2 * | 8/2012 | Duan et al. | 361/679.3 |
| 8,248,789 | B2 * | 8/2012 | Wu et al. | 361/679.56 |
| 8,315,044 | B2 * | 11/2012 | Wu et al. | 361/679.02 |
| 8,587,938 | B2 * | 11/2013 | Ahn et al. | 361/679.3 |
| 2012/0149445 | A1 * | 6/2012 | Luo et al. | 455/575.3 |
| 2012/0165082 | A1 * | 6/2012 | Kim et al. | 455/575.3 |
| 2013/0225249 | A1 * | 8/2013 | Jiang et al. | 455/575.3 |

\* cited by examiner

*Primary Examiner* — Forrest M Phillips
(74) *Attorney, Agent, or Firm* — Novak Druce Connolly Bove + Quigg LLP

(57) ABSTRACT

An electronic device includes a housing, a support board rotatably retained in the housing to support the electronic device after the support board rotates relative to the housing, a rotation module. The support board includes a main body and a sleeve formed at an end of the main body, the sleeve includes a first end and a second end opposite to the first end. The rotation module includes a hinge and a shaft, the shaft rotatably retains the first end to the housing, the hinge rotatably hinges the second end to the housing.

18 Claims, 6 Drawing Sheets

SUPPORT MECHANISM AND ELECTRONIC DEVICE

BACKGROUND

1. Technical Field

The exemplary disclosure relates to support mechanisms, particularly to support mechanisms used in electronic devices.

2. Description of Related Art

Some portable electronic products have a bracket on the back of its casing. Thus, when the bracket is opened, the portable electronic product becomes supported and able to sit on the desk or other supporting surface to make it more comfortable to view the display. A folding the bracket, flush with the back of the unit makes them more convenient to carry.

However, typical brackets of the existing portable electronic products have a complicated structure and are difficult to manufacture and use.

Therefore, there is room for improvement within the art.

BRIEF DESCRIPTION OF THE DRAWINGS

Many aspects of the exemplary support mechanism and electronic device using the support mechanism can be better understood with reference to the following drawings. These drawings are not necessarily drawn to scale, the emphasis instead being placed upon clearly illustrating the principles of the present support mechanism and electronic device. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
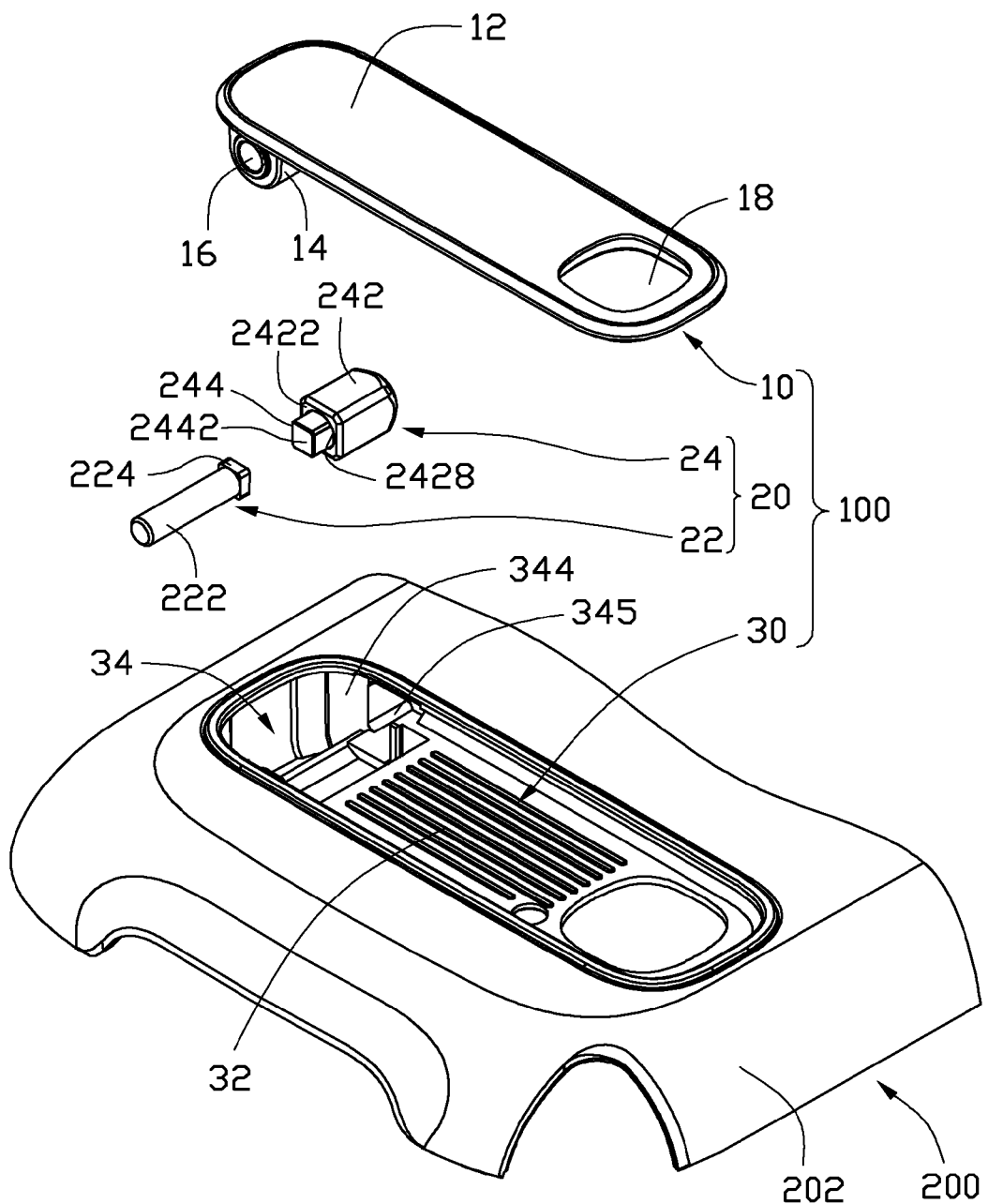
FIG. 1 is an exploded view of a support mechanism according to an exemplary embodiment.

Referring to FIG. 1, an embodiment of an electronic device 200 incorporating a support mechanism 100 is shown. The electronic device 200 includes a housing 202. The support mechanism 100 includes a support board 10, a rotation module 20 and a mount portion 30.

The support board 10 is rotatably retained to the mount portion 30 to support the electronic device after the support board 10 rotates relative to the housing 202. The support board 10 includes a main body 12 and a sleeve 14 formed at an end of the main body 12. One end of the sleeve 14 defines a shaft hole 16 (e.g., a circular hole), the other end of the sleeve 14 defines a latching hole 17 (e.g., a rectangular hole), communicating with the shaft hole 16. The support board 10 further defines a finger-grip hole 18 for the user to hold the support board 10 conveniently to use the support mechanism 100.

The rotation module 20 rotatably couples the support board 10 to the mount portion 30. In this exemplary embodiment, the rotation module 20 includes a shaft 22 and a hinge 24. The shaft 22 includes a shaft portion 222 accommodated in the shaft hole 16, and a flange 224 formed on an end of the shaft 22. The flange 224, may be rectangular, and is latched in the latching hole 17 to stationarily retain the shaft 22 to the support board 10, for the shaft 22 to rotate with the support board 10.

Figure 2:
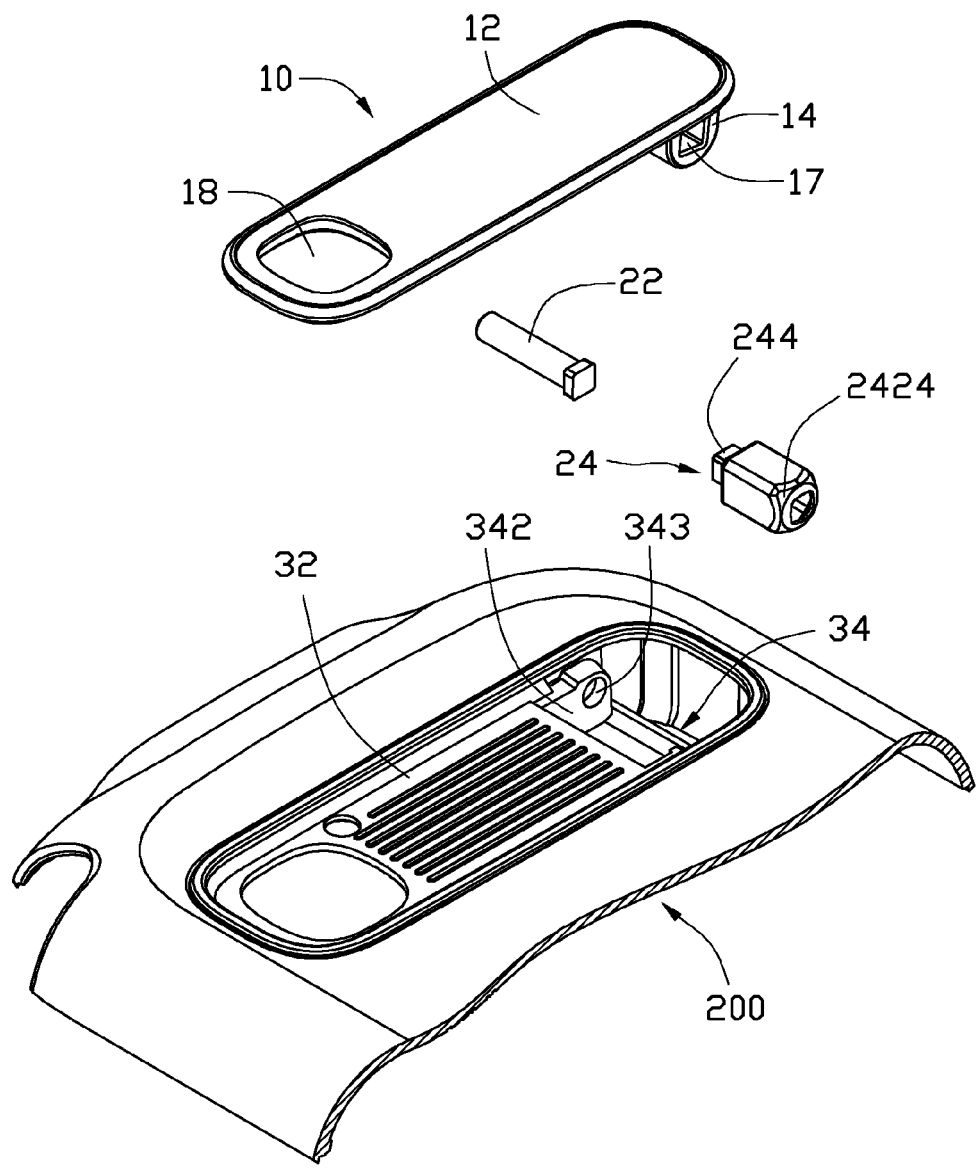
FIG. 2 is similar to the FIG. 1, showing the support mechanism in another aspect.
Figure 3:
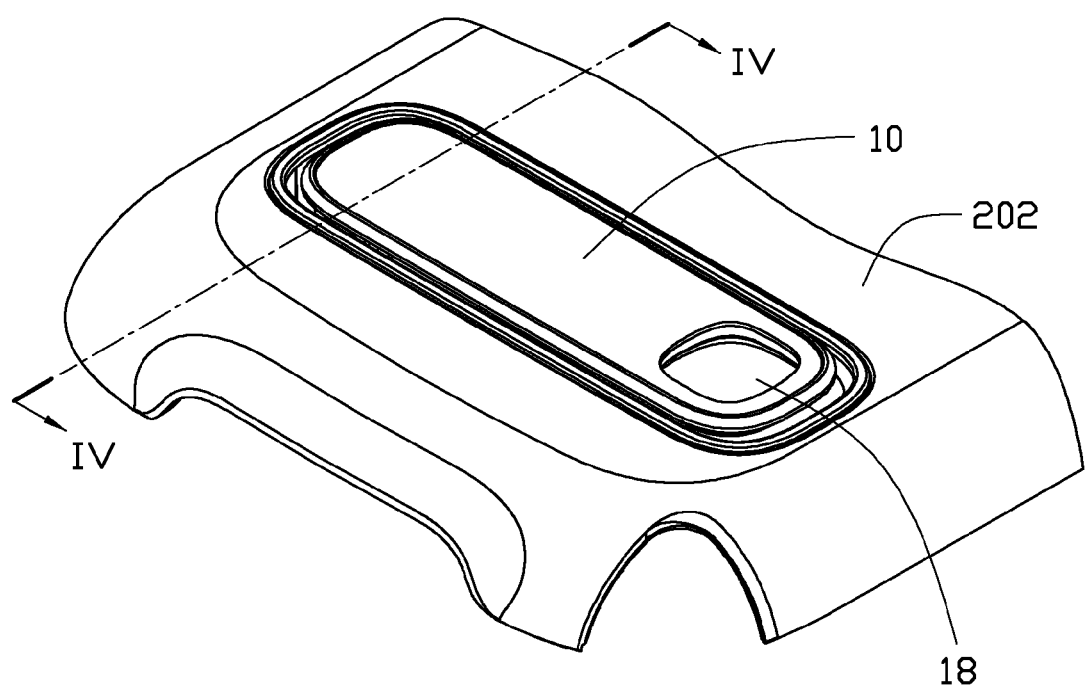
FIG. 3 is an assembled view of the support mechanism of FIG. 1.
Figure 4:
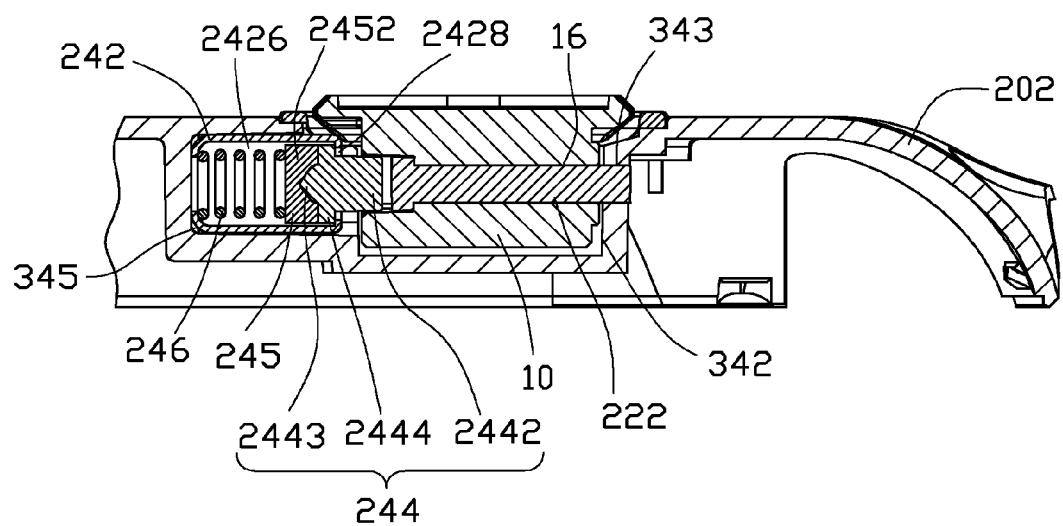
FIG. 4 is a cross sectional view of the support mechanism of FIG. 3 along the line of IV-IV.

Referring to FIGS. 3 and 4, the hinge 24 includes a can 242, a cam 244, a follower 245 and an elastic element 246. The can 242 includes a first end wall 2422 (FIG. 1), a second end wall 2424 (FIG. 2) and a compartment 2426 defined between the first end wall 2422 and the second end wall 2424. The first end wall 2422 defines an opening 2428 (FIG. 1) communicating with the compartment 2426. The elastic element 246, the follower 245, and the cam 244 are accommodated in the can 242 in turn, the follower 245 can move in the can 242 along the longitudinal axis line of the can 242. The cam 244 is exposed out of the can 242 from the opening 2428. The cam 244 includes a retaining portion 2442, a peak portion 2443 opposite to the retaining portion 2442, and a shoulder 2444 located between the retaining portion 2442 and the peak portion 2443. The retaining portion 2442 passes through the opening 2428 and is latched in the latching hole 17 so the cam 244 is stationarily retained to the support board 10, the cam 244 can rotate with the support board 10. The shoulder 2444 resists against the first end wall 2422 to prevent the cam 244 and can 242 from separating. The follower 245 includes a valley portion 2452 engaging the peak portion 2443, when the cam 244 rotates, the peak portion 2443 moves along the valley portion 2452 to drive the follower 245 to move in the can 242 along the longitudinal axis line of the can 242. The elastic element 246 is located between the second end wall 2424 and the follower 245 to provide an elastic force to drive the follower 245 to move toward the cam 244.

Referring to FIGS. 1, 2, and 4, the mount portion 30 is defined in the electronic device, for accommodating the support board 10. The mount portion 30 includes a bottom surface 32 and a receptacle 34 defined in one end of the bottom surface 32. The receptacle 34 receives the sleeve 14 and the hinge 24. The mount portion 30 further includes a first sidewall 342 and a second sidewall 344 respectively located opposite sides of the receptacle 34. The first sidewall 342 defines a circular hole 343 engaging the shaft portion 222. The second sidewall 344 defines a securing hole 345, in which the can 242 is non-rotatably secured.

Figure 5:
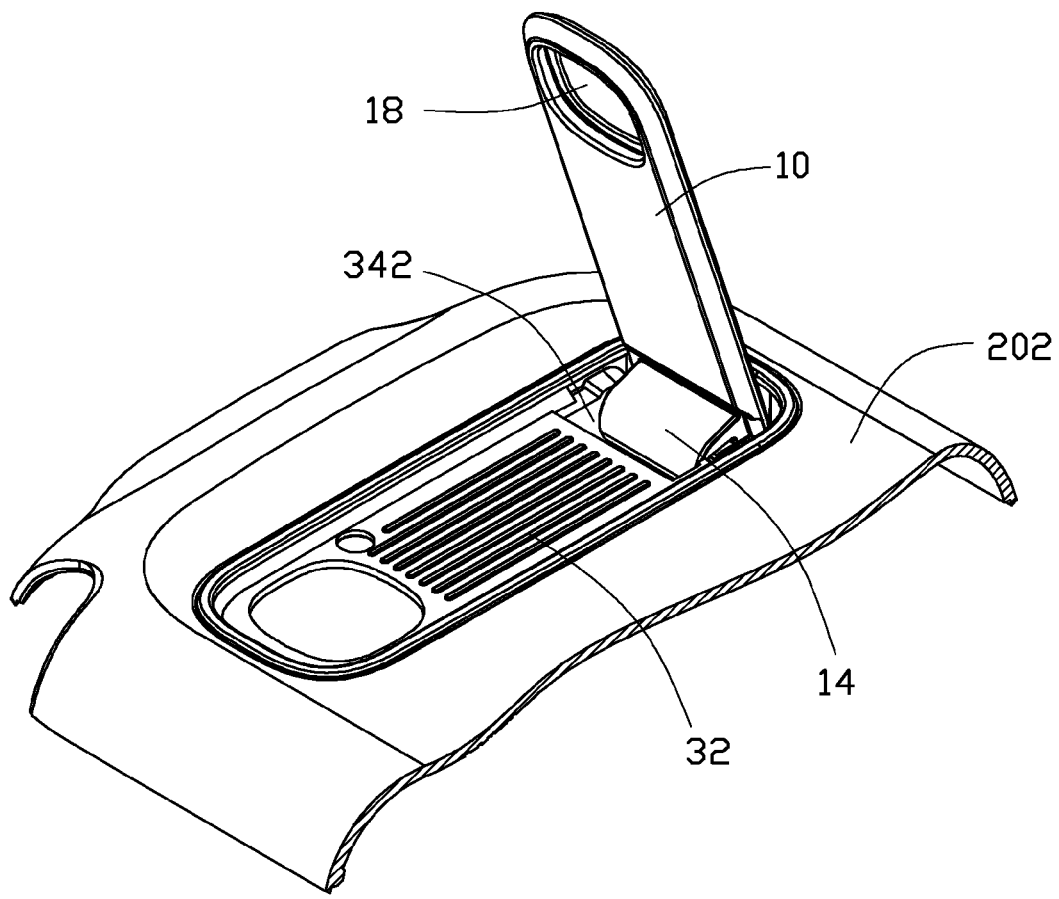
FIG. 5 is a schematic view of the support mechanism of FIG. 3 in an open position.
Figure 6:
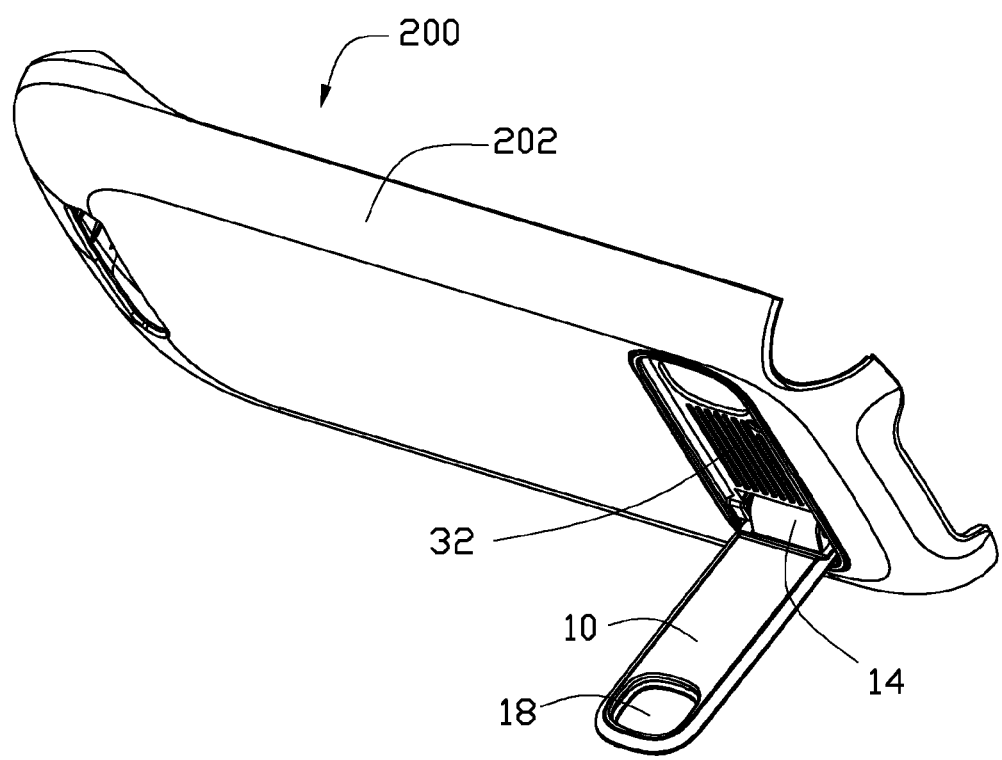
FIG. 6 is a schematic view of the support mechanism supporting an electronic device.

Referring to FIGS. 4 to 6, in use, a user can hold the support board 10, e.g., by griping the finger-grip hole 18, to make the support board 10 rotate relative to the housing 202. At this time, the sleeve 14 rotates to drive the shaft 22 to rotate in the circular hole 343, and to drive the cam 244 to rotate in the opening 2428. As the cam 244 rotates, the peak portion 2443 slides along the valley portion 2452 to drive the follower 245 to move toward the elastic element 246 so the elastic element 246 is compressed to accumulate elastic force, until the cam 244 rotates to an intermediate position. Once the cam 244 rotates over the intermediate position, the cam 244 automatically rotates relative to the follower 245 under the elastic force of the elastic element 246, until the peak portion 2443 mates with the valley portion 2452 again. During this stage, because the cam 244 is retained in the sleeve 14 of the support board 12, the cam 244 rotates with the support board 12 until the support board 10 is opened to an open position like shown in FIGS. 5 and 6. At this time, the support board 10 is angled with the housing 202 to make sure the housing 202 and the electronic device are at a comfortable viewing angle.

Even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A support mechanism for supporting a housing of an electronic device, the support mechanism comprising:
   a support board comprising a main body and a sleeve formed at an end of the main body, the sleeve comprising a first end and a second end opposite to the first end;
   a rotation module comprising a hinge and a shaft, the shaft rotatably retaining the first end to the housing, the hinge rotatably hinging the second end to the housing;
   wherein both the shaft and the hinge are stationarily latched by the second end of the sleeve, and are spaced from each other, the sleeve rotates to drive the shaft and the hinge to rotate.

2. The support mechanism of claim 1, wherein the first end defines a shaft hole, the second end defines a latching hole communicating with the shaft hole; the shaft includes a shaft portion and a flange formed on an end of the shaft; the flange is latched in the latching hole to stationarily retain the shaft to the support board, the shaft portion passes through the shaft hole and rotatably retained to the housing.

3. The support mechanism of claim 2, wherein the hinge comprised a can non-rotatably retained to the housing, a cam, a follower and an elastic element; the can includes a first end wall, a second end wall and a compartment defined between the first end wall and the second end wall; the elastic element, the follower, the cam are accommodated in the can in turn.

4. The support mechanism of claim 3, wherein the first end wall defines an opening communicating with the compartment, the cam includes a retaining portion passing through the opening and latched in the latching hole so the cam is stationarily retained to the support board.

5. The support mechanism of claim 4, wherein the follower is capable of moving in the can along a longitudinal axis line of the can.

6. The support mechanism of claim 5, wherein the cam further comprises a peak portion opposite to the retaining portion, the follower comprises a valley portion engages the peak portion; when the cam rotates, the peak portion moves along the valley portion to drive the follower to move in the can along the longitudinal axis line of the can.

7. The support mechanism of claim 6, wherein the cam further comprises a shoulder located between the retaining portion and the peak portion, the shoulder resists against the first end wall to prevent the cam and can from separation.

8. The support mechanism of claim 3, wherein the elastic element is located between the second end wall and the follower to provide an elastic force to drive the follower to move toward the cam.

9. The support mechanism of claim 1, wherein the support board defines a finger-grip hole for user holding the support board.

10. An electronic device, comprising:
    a housing;
    a support board rotatably retained to the housing to support the electronic device after the support board rotates relative to the housing, the support board comprising a main body and a sleeve formed at an end of the main body, the sleeve comprising a first end and a second end opposite to the first end;
    a rotation module comprising a hinge and a shaft, the shaft rotatably retaining the first end to the housing, the hinge rotatably hinging the second to the housing;
    wherein both the shaft and the hinge are stationarily latched by the second end of the sleeve, and are spaced from each other, the sleeve rotates to drive the shaft and the hinge to rotate.

11. The electronic device of claim 10, wherein the first end defines a shaft hole, the second end defines a latching hole communicating with the shaft hole; the shaft includes a shaft portion and a flange formed on an end of the shaft; the flange is latched in the latching hole to stationarily retain the shaft to the support board, the shaft portion passes through the shaft hole and rotatably retained to the housing.

12. The electronic device of claim 11, wherein the hinge comprised a can non-rotatably retained to the housing, a cam, a follower and an elastic element; the can includes a first end wall, a second end wall and a compartment defined between the first end wall and the second end wall; the elastic element, the follower, the cam are accommodated in the can in turn.

13. The electronic device of claim 12, wherein the first end wall defines an opening communicating with the compartment, the cam includes a retaining portion passing through the opening and latched in the latching hole so the cam is stationarily retained to the support board.

14. The electronic device of claim 13, wherein the follower is capable of moving in the can along a longitudinal axis line of the can.

15. The electronic device of claim 14, wherein the cam further comprises a peak portion opposite to the retaining portion, the follower comprises a valley portion engages the peak portion; when the cam rotates, the peak portion moves along the valley portion to drive the follower to move in the can along the longitudinal axis line of the can.

16. The electronic device of claim 15, wherein the cam further comprises a shoulder located between the retaining portion and the peak portion, the shoulder resists against the first end wall to prevent the cam and can from separation.

17. The electronic device of claim 12, wherein the elastic element is located between the second end wall and the follower to provide an elastic force to drive the follower to move toward the cam.

18. The electronic device of claim 10, wherein the support board defines a finger-grip hole for user holding the support board.

* * * * *